US011165515B2

(12) United States Patent
Tiebout et al.

(10) Patent No.: US 11,165,515 B2
(45) Date of Patent: Nov. 2, 2021

(54) PRE-DISTORTION TECHNIQUE FOR A CIRCUIT ARRANGEMENT WITH AN AMPLIFIER

(71) Applicant: Infineon Technologies AG, Neubiberg (DE)

(72) Inventors: Marc Tiebout, Finkenstein (AT); Michele Caruso, Finkenstein (AT); Daniele Dal Maistro, Villach (AT); Carlo Rubino, Villach Warmbad Judendorf (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/683,488

(22) Filed: Nov. 14, 2019

(65) Prior Publication Data

US 2020/0169333 A1 May 28, 2020

(30) Foreign Application Priority Data

Nov. 22, 2018 (DE) ...................... 10 2018 220 101.3

(51) Int. Cl.
*H04B 1/62* (2006.01)
*H04B 17/13* (2015.01)
(Continued)

(52) U.S. Cl.
CPC .............. *H04B 17/13* (2015.01); *G01R 29/26* (2013.01); *H03F 1/3247* (2013.01); *H03F 3/211* (2013.01);
(Continued)

(58) Field of Classification Search
CPC ........ H04B 17/00; H04B 17/10; H04B 17/11; H04B 17/13; H04B 17/15; H04B 17/19; H04B 1/04; H04B 1/0475; H04B 2001/0408; H04B 2001/0425; H04B 2001/0441; H04B 2001/0416; H04B 2001/045; H03F 3/20; H03F 3/211; H03F 1/32; H03F 1/3223; H03F 1/3241;
(Continued)

(56) References Cited

U.S. PATENT DOCUMENTS 6,275,685 B1 8/2001 Wessel et al.
6,356,146 B1 * 3/2002 Wright .................. H03F 1/3241
330/149

(Continued)

OTHER PUBLICATIONS

Office Action, DE 10 2018 220 101.3, dated Aug. 14, 2001, pp. 8.

*Primary Examiner* — Siu M Lee
(74) *Attorney, Agent, or Firm* — Armis IP Law, LLC

(57) ABSTRACT

A circuit includes an amplifier and pre-distortion circuit. The amplifier amplifies a modulated signal. The signal pre-distortion circuit performs a feed-forward pre-distortion of the modulated signal in a signal path in which the amplifier resides. The signal pre-distortion circuit includes: i) an envelope detector configured operative to provide an envelope information describing an envelope of the modulated signal; and ii) a built-in test circuit that determines distortion information describing a distortion in the signal path caused by amplitude variations. The signal pre-distortion circuit performs the feed-forward pre-distortion of the modulated signal on the basis of the distortion information.

32 Claims, 9 Drawing Sheets

(51) Int. Cl.
*H04B 17/19* (2015.01)
*H04B 1/04* (2006.01)
*H03F 1/32* (2006.01)
*H03F 3/21* (2006.01)
*G01R 29/26* (2006.01)

(52) U.S. Cl.
CPC ........... *H04B 1/0475* (2013.01); *H04B 17/19* (2015.01); *H03F 2200/102* (2013.01); *H03F 2200/451* (2013.01); *H03F 2201/3227* (2013.01); *H03F 2203/21106* (2013.01); *H04B 2001/0416* (2013.01); *H04B 2001/0441* (2013.01)

(58) Field of Classification Search
CPC .... H03F 1/3247; H03F 1/3252; H03F 1/3282; H03F 1/3288; H03F 2200/451; H03F 2200/102; H03F 2203/211106; H03F 2201/3224; H03F 2201/3227; G01R 29/26
See application file for complete search history.

(56) References Cited

U.S. PATENT DOCUMENTS

| | | | | |
|---|---|---|---|---|
| 6,400,775 B1* | 6/2002 | Gourgue | ............... | H03F 1/3247 330/149 |
| 6,697,436 B1* | 2/2004 | Wright | ............... | G01N 27/4163 330/106 |
| 6,798,843 B1* | 9/2004 | Wright | ............... | H03F 1/3241 330/149 |
| 7,042,283 B2* | 5/2006 | Suzuki | ............... | H03F 1/0288 330/124 R |
| 9,088,319 B2* | 7/2015 | Peng | ............... | H03F 1/3241 |
| 10,027,284 B2* | 7/2018 | Staudinger | ............... | H03F 3/19 |
| 2005/0156662 A1* | 7/2005 | Raghupathy | ............ | H03F 1/3282 330/10 |
| 2005/0195030 A1* | 9/2005 | Okazaki | ............... | H04B 1/62 330/149 |
| 2006/0091950 A1* | 5/2006 | Hayase | ............... | H03F 1/3247 330/149 |
| 2006/0158254 A1* | 7/2006 | Johnson | ............... | H03F 1/3247 330/149 |
| 2007/0135065 A1* | 6/2007 | Leffel | ............... | H03F 1/3288 455/114.3 |
| 2007/0190952 A1* | 8/2007 | Waheed | ............... | H04B 1/0475 455/114.3 |
| 2007/0296494 A1* | 12/2007 | Hongo | ............... | H03F 1/3247 330/149 |
| 2009/0004981 A1* | 1/2009 | Eliezer | ............... | H03F 1/3282 455/127.1 |
| 2009/0221245 A1* | 9/2009 | Gonikberg | ............ | H03F 1/3241 455/114.3 |
| 2014/0126669 A1* | 5/2014 | Mahoney | ............... | H04L 27/362 375/296 |
| 2014/0162576 A1* | 6/2014 | Dufrene | ............... | H03M 1/66 455/114.3 |
| 2015/0024699 A1* | 1/2015 | Muhammad | ............... | H03F 1/34 455/114.3 |
| 2015/0236877 A1* | 8/2015 | Peng | ............... | H04L 25/08 375/297 |
| 2017/0353163 A1* | 12/2017 | Gazneli | ............... | H03F 1/3247 |

* cited by examiner

PRE-DISTORTION TECHNIQUE FOR A CIRCUIT ARRANGEMENT WITH AN AMPLIFIER

RELATED APPLICATION

This application is related to and claims priority to earlier filed German patent application serial number 10 2018 220101.3 entitled "PRE-DISTORTION TECHNIQUE FOR A CIRCUIT ARRANGEMENT WITH AN AMPLIFIER," filed on Nov. 22, 2018, the entire teachings of which are incorporated herein by this reference.

TECHNICAL FIELD

The present document relates to circuit arrangements having amplifiers (e.g., radio frequency, RF, amplifiers, high frequency, HF, amplifiers, mmWave amplifiers, etc.), such as power amplifiers.

The document also relates to techniques for adjusting (e.g., by pre-distortion) phase shift and/or gain in a circuit arrangement having an amplifier (e.g., a power amplifier), such as a radio frequency, RF, amplifier, high frequency, HF, amplifier, mmWave amplifier, and so on. The circuit arrangement may be used, for example, for a beamforming application. The techniques may be, for example, feed-forward techniques.

The document also relates to methods for adjusting phase shift and/or gain in a circuit arrangement having an amplifier (e.g., power amplifier), such as a radio frequency, RF, amplifier, high frequency, HF, amplifier, mmWave amplifier, and so on.

BACKGROUND

A circuit arrangement with an amplifier (e.g., power amplifier), such as a RF amplifier, HF amplifier, mmWave amplifier, and so on, may be used, for example, for feeding an antenna element. The antenna element may constitute, together with other antenna elements, an antenna array. The antenna array may be used for beamforming, e.g., in communication or localization applications.

In order to minimize power consumption, the efficiency shall be high. However, in particular for power amplifiers, increasing efficiency tends to reduce linearity, causing amplitude distortion and/or phase distortion. For example, at some ranges of values of the input signal, the amplified signal may saturate, hence losing linearity and increasing distortion. Therefore, an increase of efficiency normally comes at the expenses of linearity and quality.

It is possible to try to cope with these impairments by using a digital pre-distortion technique. The signal at the output of the amplifier may be converted into a digital version, which is fed back and subtracted from the digital input signal. The feedback-based pre-distortion technique may be operated so as to prevent the digital input signal from reaching the frequency ranges at which it would saturate, hence preserving linearity.

Such a digital feedback-based pre-distortion technique requires dedicated hardware equipment. For example, the signal at the output of the amplifier shall be converted into a digital version, and provided to a digital signal processor, DSP, for performing the subtraction. Hence a downconverter and an analog-to-digital converter, ADC, or a RF-to-digital converter, operating in real time is needed. The ADC or RF to digital converter is necessary for each antenna element of the antenna array: accordingly, 64 antenna elements require 64 ADCs or RF-to-digital converters.

Further, a great amount of processing power is necessary for performing the online subtractions at the DSP.

Moreover, in order to reduce the number of components such as DSPs, ADCs, RF-to-digital converters, DACs, and digital-to-RF converters, a technique has been attempted consisting in performing one single digital pre-distortion for multiple amplifiers (e.g., power amplifiers). However, it is in general not ensured that all the amplifiers are subject to the same distortions. Hence, using one single digital pre-distortion for multiple, different amplifiers inherently leads to incorrect or suboptimal pre-distortions for at least some of the amplifiers.

It is desirable to find a way to implement a pre-distortion principle that solves at least one of these problems, to advantageously reduce or get rid of unwanted amplitude and/or phase distortions.

BRIEF DESCRIPTION OF EMBODIMENTS

In accordance to an aspect, there is provided a circuit arrangement, comprising:
an amplifier (e.g., RF, HF, mmWave amplifier) to amplify a modulated signal (e.g., RF, HF, mmWave signal);
a signal pre-distortion circuit to perform a feed-forward pre-distortion of the modulated signal in a signal path comprising the amplifier, the signal pre-distortion circuit includes:
an envelope detector operative to provide an envelope information describing an envelope of the modulated signal; and
a built-in test circuit configured to determine a distortion information describing a distortion in the signal path caused by amplitude variations;
the signal pre-distortion circuit is operative to perform the feed-forward pre-distortion of the modulated signal on the basis of the distortion information so that:
a variable phase shift is applied to a signal in the signal path in dependence on the envelope information, such that a relationship between the envelope information and the variable phase shift depends on the distortion information provided by the built-in test circuit; and/or
a gain of a signal in the signal path is controlled in dependence on the envelope information, such that a relationship between the envelope information and a gain control signal depends on the distortion information provided by the built-in test circuit.

Accordingly, there is no need for a digital feedback from the output signal. To the contrary, the feedforward technique may be easily implemented reducing the computation efforts. In particular when analog components are used, it is possible to reduce the number of DACs, digital-to-RF converters, ADCs and RF-to-digital converters.

In particular for applications using a plurality of amplifiers, each being subject to distortion, it is possible to make use of one single processor and one related RF to digital chain. It is not necessary to use multiple processors for multiple circuit arrangements.

The operation session may include:
determining the envelope of the input signal;
on the basis of the determined relationships, mapping the envelope into a phase shift and/or amplitude adjustment so as to shift the phase and/or adjust the amplitude of the input signal.

There is also provided a method for feeding an antenna array feeding an antenna array with the amplified output signals generated in the operation session.

There is also provided a non-transitory storage unit including instructions which, when performed by a processor, cause the processor to operate according to one of the methods above.

Further embodiments herein include:

A circuit arrangement comprising:
an amplifier to amplify a modulated signal;
a signal pre-distortion circuit to perform a feed-forward pre-distortion of the modulated signal in a signal path comprising the amplifier, the signal pre-distortion circuit including:
an envelope detector operative to provide envelope information describing an envelope of the modulated signal; and
a built-in test circuit operative to determine distortion information describing a distortion in the signal path caused by amplitude variations;
the signal pre-distortion circuit being operative to perform the feed-forward pre-distortion of the modulated signal based on the distortion in-formation in which:
a variable phase shift is applied to a signal in the signal path dependent on the envelope information, and a relationship between the envelope information and the variable phase shift being de-pendent on the distortion information provided by the built-in test circuit; and
a gain of a signal in the signal path is controlled dependent on the envelope information, in which a relationship between the envelope information and a gain control signal depends on the distortion information provided by the built-in test circuit.

In accordance with further embodiments, the signal pre-distortion circuit is operative to adjust the variable phase shift to follow instantaneous envelope information and provide a gain control signal to follow instantaneous envelope information.

In accordance with still further embodiments, the envelope detector is operative to provide the envelope information as an analog envelope signal, the circuit arrangement further comprising: a mapping circuit operative to: map the analog envelope signal onto an analog phase shift adjustment signal, and adjust a mapping characteristic, depending on the distortion information; and map the analog envelope signal onto an analog gain control signal, and adjust a mapping characteristic, depending on the distortion information.

In yet further example embodiments, the signal pre-distortion circuit includes a mapping circuit operable to: i) obtain a non-linear, adjustable mapping characteristic, and ii) adjust the non-linear map-ping characteristic depending on the envelope information.

In still further example embodiments, the signal pre-distortion circuit is operative in which bandwidths of at least one selected from: an envelope detector, a mapping circuit, a signal phase shifter, and a gain adjuster are larger than modulation bandwidth of a modulation imposed on the modulated signal.

In yet further example embodiments, the signal pre-distortion circuit is operative in which bandwidths of at least one selected from: an envelope detector, a mapping circuit, a signal phase shifter, and a gain adjuster are larger than or equal to two times the modulation band-width imposed on the modulated signal.

In accordance with further example embodiments, the signal pre-distortion circuit is operative to modify the gain of the amplifier depending on the envelope information, and a relationship between the envelope in-formation and in which the gain depends on the distortion information.

In yet further example embodiments, the built-in test circuit is operative to determine the distortion information which comprises in-formation about an amplitude-modulation-to-amplitude-modulation distortion and an information about an amplitude-modulation-to-phase-modulation distortion.

In accordance with further embodiments, the built-in test circuit is operative to determine, in a test mode, an amplitude at the output of the amplifier to derive distortion information and a phase at the output of the amplifier to derive distortion information.

In one embodiment, a test signal source is operative to inject a test signal having a settable amplitude in which the built-in test circuit measures distortion information relative to the signal at the output of the amplifier.

In still further embodiments, the circuit switches between a test mode and an operating mode, thereby, in the test mode, measure distortion information and determine an adjustable relationship between envelope information and the variable phase shift and the gain control signal.

In accordance with yet further example embodiments, the circuit is further operative to generate, in the test mode, a plurality of test signals at different amplitudes.

In accordance with further example embodiments, the signal pre-distortion circuit is operative to define the distortion information which comprises information associated to a state which, in the test mode, reduces distortion of the output test signal.

In accordance with further embodiments, the signal pre-distortion circuit is operative to comparatively increase the phase shift and reduce the amplitude of a signal in the signal path for a comparatively higher envelope, and comparatively reduce the phase shift and increase the amplitude of a signal in the signal path for a comparatively lower envelope.

In accordance with further embodiments, the signal pre-distortion circuit is operative to: adjust the variable phase shift and the amplitude of a signal in the signal path for a comparatively higher amount in case of comparatively higher distortion information, and adjust the variable phase shift and the amplitude of a signal in the signal path for a comparatively lower amount in case of a comparatively lower distortion information.

In accordance with further example embodiments, the circuit further comprises a chip structure including a calibration processor operative to: i) measure the distortion information from the output of the amplifier and ii) control a map-ping between the envelope information and the variable phase shift and the gain control signal.

In accordance with further example embodiments, the circuit as described herein includes a chip structure or a board structure including the signal pre-distortion circuit.

In still further example embodiments, the circuit comprises a plurality of amplifiers in which the circuit arrangement comprises a common signal source, the circuit arrangement is operative to derive a plurality of signals to be amplified by the amplifiers from an input signal provided by the common signal source, and the signal pre-distortion circuit is operative to subject each of the derived signals to a pre-distortion on the basis of distortion information associated to each of the amplifiers.

In accordance with further example embodiments, embodiments herein include a method for applying a variable phase shift and adjusting the amplitude of an input signal subjected to amplification by an amplifier, the method comprising:

a calibration session and an operation session,
the calibration session including:
producing distortion information regarding the distortion of a test signal;
determining relationships between envelopes of the test signal and a phase shift and amplitude adjustment to be applied to the input signal in the operation session based on the distortion information; and the operation session further including:
determining an envelope of the input signal;
mapping the envelope into a phase shift and amplitude adjustment to shift the phase and adjust the amplitude of the input signal based on the determined relationships.

In accordance with further embodiments, the calibration sessions are performed at intervals equal to or greater than 3600 seconds.

In further example embodiments, the calibration session further comprises performing a plurality of iterations, each iteration determining distortion information of one particular amplifier among a plurality of amplifiers.

Further embodiments herein include a method for beamforming, comprising a method including: feeding an antenna array with the amplified output signals generated in the operation session.

In accordance with further example embodiments, a non-transitory storage unit storing instructions which, when executed by a processor, cause the processor to perform any method as described herein.

DETAILED DESCRIPTION

Figure 1A:
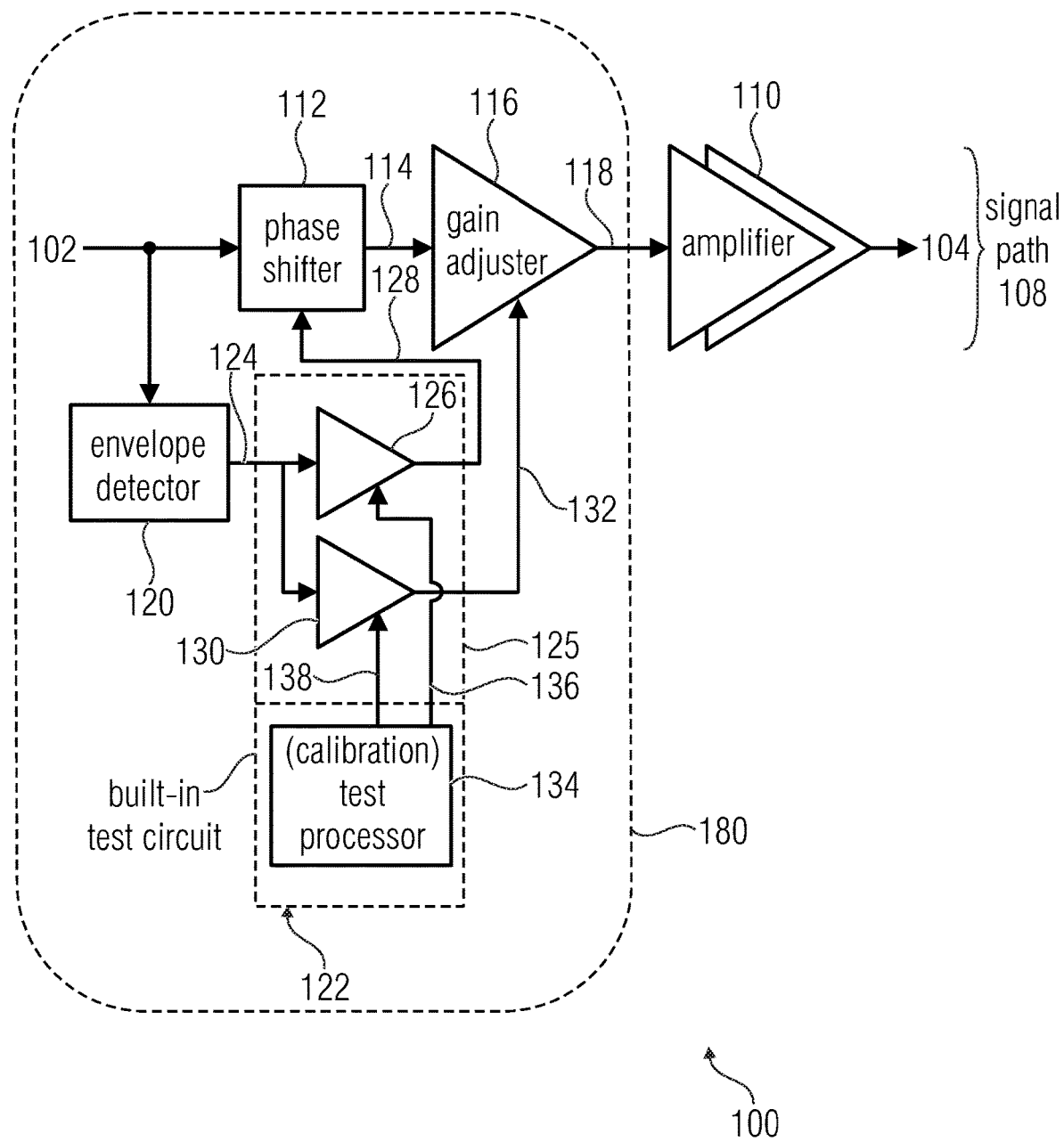
FIGS. 1A-6 show circuit arrangements or components thereof according to examples.

FIG. 1a shows an example of circuit arrangement 100. The circuit arrangement 100 may comprise an amplifier 110 (e.g., a RF power amplifier, a HF power amplifier or a mmWave power amplifier) which amplifies an input signal 102 (or a processed version thereof), to generate an analog output signal 104 (e.g., RF, HF, or mmWave signal output). The analog output signal 104 may be fed, for example, to an antenna (e.g., RF, HF, or mmWave antenna), such as an antenna element of an antenna array. The amplified signal 104 may be a processed and/or amplified version of an input signal 102 (e.g., a RF input signal, HF input signal, or mmWave input signal). The input signal 102 may be an analog signal. The input signal 102 may be a modulated signal (e.g., a RF modulated input signal, HF modulated input signal, or mmWave modulated input signal).

A signal path 108 may be used to describe processing applied to the input signal 102 (or a version thereof) up to the amplifier 110. In general terms, along the signal path 108, several versions (e.g., analog versions) of the input signal 102 (e.g., intermediate versions 114 and 118) are processed to generate the final version to be amplified to generate the amplified signal 104.

As such, the amplifier 110 may be subjected to unrequested amplitude variations, which tend to reduce linearity. However, it has been noted that these variations can be compensated even without a feedback-based technique.

In order to condition the input signal 102 (or another version thereof) in the signal path 108, a signal pre-distortion circuit 180 may be implemented. The signal pre-distortion circuit 180 may operate upstream of the amplifier 110 (in some variants the pre-distortion circuit may in particular directly operate on the amplifier 110). The signal pre-distortion circuit 180 may operate in feed-forward. The signal pre-distortion circuit 180 may comprise a plurality of elements, at least one of which may be a hardware element. The signal pre-distortion circuit 180 may comprise at least one analog element. The at least one analog element may internally operate analogically and may be input with and/or output analog signals. In examples, the signal pre-distortion circuit 180 may comprise at least one element, which may internally operate digitally, but may be input with and/or output an analog signal (and, therefore, integrates DACs and/or digital-to-RF converters and/or ADCs and/or RF-to-digital converters).

The signal pre-distortion circuit 180 (or at least some components thereof) may coexists with the amplifier 110 in the same board (or in the same chip). The signal pre-distortion circuit 180 may comprise (or may be fully or partially integrated in) at least one built-in circuit 122, which may coexist with the amplifier in the same board (or chip).

The signal pre-distortion circuit 180 may comprise, in the signal path 108, components which permit to modify the input signal 102 without a feedback-based technique and without excessively reducing linearity.

The signal pre-distortion circuit 180 may comprise, in the signal path 108, a variable phase shifter 112 to provide a phase-shifted version 114 of the input signal 102. The phase shifter 112 may shift the phase of the signal 102 so as to compensate for the unwanted phase variations normally caused by the amplifier 110. The phase shifter 112 may be an analog component and/or may internally operate analogically and/or may provide an analog output. The phase shifter 112 may comprise a resistor-capacitor, RC, circuit, with a variable capacitance. E.g., the phase shifter 112 may comprise multiple capacitors in parallel, at least some capacitors being selectable, so as to vary the total capacitance of the parallel. In some examples, the phase shifter 112 may be controlled digitally.

The signal pre-distortion circuit 180 may comprise, in the signal path 108, a gain adjuster 116 to provide an amplitude-adjusted version 118 of the input signal 102. The gain adjuster 116 may modify the amplitude of the input signal 102 (or its phase-shifted version 114) so as to compensate for the unwanted amplitude variations normally caused by the amplifier 110. The gain adjuster 116 may be an analog component and/or may internally operate analogically and/or may provide an analog output. The gain adjuster 116 may comprise, for example, an analog amplifier with a controllable gain.

In alternative examples, the phase shifter 112 may be positioned downstream to the gain adjuster 116.

FIG. 1A does not show possible additional elements. For example, a delay generator may be inserted (e.g., upstream or downstream) to control the beamforming.

It has been understood that, even without a digital feedback from the output signal 104, the consequences of the non-linearity of the amplifier 110 may be reduced or avoided. This result has been achieved, inter alia, on the basis of the understanding that a feed-forward technique may be used instead of a feedback-based one. Therefore, the amount of the phase shift and/or the amount of gain adjustment may be determined on the basis of the input signal 102, instead of the amplified output signal 104.

For example, it is possible to perform a pre-distortion by adjusting the phase shift and/or the gain to follow envelope information which is instantaneously determined from the signal 102. In fact, the amount of the phase shift and/or the amount of gain adjustment can be determined on the basis of envelope information describing the envelope of the input signal 102. In general terms, the larger the envelope of the input signal 102, the larger will be the envelope of the amplified signal 104, the larger the non-linearity, which will require a stronger pre-distortion. Therefore, the pre-distortion may be provided so that, for larger envelopes, the phase and/or the gain of the signal in the signal path 108 are modified more than for smaller envelopes so as to compensate for the incorrect amplification. A non-linear adjustment may therefore be obtained. The compensation may be achieved even without relying on a feedback from the output of the amplifier 110.

In order to instantaneously obtain the envelope information, the circuit arrangement 100 may comprise an envelope detector 120. The envelope detector 120 may detect the envelope of the input signal 102. The envelope detector may be an analog component and/or may internally operate analogically and/or may provide an analog output. The envelope detector 120 may comprise a low-pass filter for detecting the envelope of the input signal 102. The envelope information may produce a signal (indicated with 124) shaped as (or otherwise providing information on) the envelope of the input signal 102. The envelope signal 124 may be, for example, an analog signal (but in other examples may be a digital signal).

The envelope signal 124 may be mapped onto a phase shift adjustment signal 128 (which may be, for example, an analog signal or a digital signal). The phase shift adjustment signal 128 may be provided to the phase shifter 112 to condition the input signal 102 on the basis of the envelope signal 124. In general terms, values of the envelope of the input signal 102 may be mapped into values of the shift adjustment signal 128, which will be used by the phase shifter 112 to determine the phase shift to be imposed to the input signal 102. The element 126 is the element, which generates the phase shift adjustment signal 128. The element 126 may be an analog component and/or may internally operate analogically and/or may provide an analog output (phase shift adjustment signal 128). The element 126 may be an analog mapping circuit, which maps the envelope analog signal 124 onto the analog phase shift adjustment signal 128, for example. The mapping may be non-linear, as it is intended to compensate for non-linearities: in case of small envelope, the phase shifter 112 may avoid to modify the input signal 102 substantially; but, in case of larger envelope, the phase shifter 112 may modify the phase of the input signal 102 for a great amount. In some examples, the element 126 may therefore be an amplifier with non-constant gain, and may have gain which increases with the increase of its input signal (envelope information 124). In other examples the element 126 has a linear behavior, and a non-linear behavior is exhibited by the phase shifter 112.

The envelope signal 124 may be mapped onto a gain control signal 132 (which may be, for example, an analog gain control signal or a digital signal). The gain control signal 132 may be provided to the gain adjuster 116 to condition the input signal 102 (or its phase-shifted version 114 or another version in the signal path 108) on the basis of the envelope signal 124. In general terms, values of the envelope of the input signal 102 may be mapped into values of the gain control signal 132, which will be used by the gain adjuster 116 to determine an amplification to be imposed to the input signal 102 (or its phase-shifted version 114 or another version in the signal path 108). The element 130 (which is here the generator of the gain control signal 132) may be an analog component and/or may internally operate analogically and/or may provide an analog output (phase gain control signal 132). (In other examples, the element 130 may be a digital element.) The element 130 may be an analog mapping circuit which maps the envelope analog signal 124 onto the analog gain control signal 132. For example, an increase of the envelope signal may cause a reduction of the gain at the gain adjuster 116. The mapping may be non-linear, as it is intended to compensate for non-linearities: in case of small envelope, the gain adjuster 116 may avoid to modify substantially the amplitude of the input signal 102; but, in case of larger envelope, the gain adjuster 116 may modify substantially the amplitude of the signal (e.g., its version 114) in the signal path 108. In other examples, it is the gain adjuster 116 that has a non-linear behavior, while the element 130 is linear.

The mapping circuits 126 and 130 are collectively indicated with the reference numeral 125, and may be part of the built-in test circuit 122. They define a relationship between the envelope of the input signal 102 and the parameters for the pre-distortion.

While the phase shift adjustment signal 128 and/or gain control signal 132 may follow, in real time, instantaneous values of the envelope, the mapping functions from the envelope to the adjustment signals 128 and/or 132 do not vary instantaneously and are in general maintained for long periods of time.

The signal pre-distortion circuit 180 of the circuit arrangement 100 may adjust the relationships between the envelope information 124 and the variable phase shift (applied by the phase shifter 112) and/or the gain (applied by the gain adjuster 116). For example, the mapping functions defining the relationship between the envelope information 124 and the adjustment signals 128 and 132 may be determined (e.g., a priori) on the basis of distortion information which is provided by a built-in test circuit 122. The built-in test circuit 122 may comprise a test processor 134 which may provide phase-related distortion information 136 (e.g., information about an amplitude-modulation-to-phase-modulation distortion) and/or gain-related distortion information 138 (e.g., information about an amplitude-modulation-to-amplitude-modulation distortion). Therefore, the mapping functions adopted at the components 126 and 130 may be adjusted on the basis of the distortion information 136 and/or 138. The distortion information 136 and/or 138 may be or comprise digital signal(s) generated by the test processor 134 and converted into analog signal(s) by digital-to-analog converter(s), not shown in FIG. 1.

The relationships between the envelope and the adjustment signals 128 and/or 132 may be determined occasionally and/or at sporadic time instants, and may be maintained without real-time feedback-based techniques. For example, test (calibration) sessions may be performed at the initialization of the circuit arrangement 100 and/or when the circuit arrangement is switched on and/or (e.g., periodically) at a frequency enormously greater than the bandwidth of the input signal 102. In some examples, test sessions may be performed at time intervals of 1 hour (3600 seconds) or more. In some examples, a test session may be performed when the circuit arrangement 100 is in a test mode. In test mode, a signal source of the circuit arrangement 100 may inject a predefined signal as the input signal, and the output signal obtained with the injected signal is measured. The sampled values of the measured signal may be compared to a predetermined set of expected values, as to determine the mappings to be performed by components 126 and/or 130 to subsequently control the phase shifter 112 and the gain adjuster 116 on the basis of the envelope information 124. Therefore, the distortion information provided by the signals 136 and/or 138 may be obtained during calibration, and subsequently maintained until a new calibration is performed.

The signal pre-distortion may be performed so that the phase shift and/or the amplitude is adjusted for a comparatively higher amount in case of comparatively higher distortion information, and for a comparatively lower amount in case of a comparatively lower distortion information.

In general the phase shifter 112 and/or the gain adjuster 116 may compensate the amplitude variations caused by the amplifier 110 according to a feed-forward strategy which keeps into account, besides the instantaneous value of the envelope information 124, also specific distortion information 136 and/or 138 previously defined during a calibration session.

Accordingly, unwanted distortion of the amplifier 110 is compensated on line, without excessively wasting processing power. When the compensation is performed analogically, no increase of hardware equipment is required, as the necessity of DACs or digital-to-RF converters and ADCs or RF-to-digital converter is reduced. Notably, one single test processor may be used for multiple amplifiers (e.g., power amplifiers), as it is possible to subject one single amplifier to one test session at time, and to derive the distortion information individually. With respect to the feedback-based technique, an important reduction of hardware and/or software resources may therefore be achieved when only analog components are used.

In examples, bandwidths of the envelope detector 120 or the mapping circuit 126, 130 and/or phase shifter 112 are larger than the modulation bandwidth of a modulation imposed on the modulated signal 102, or, in some particular examples, larger than or equal to two times the modulation bandwidth.

Figure 1B:
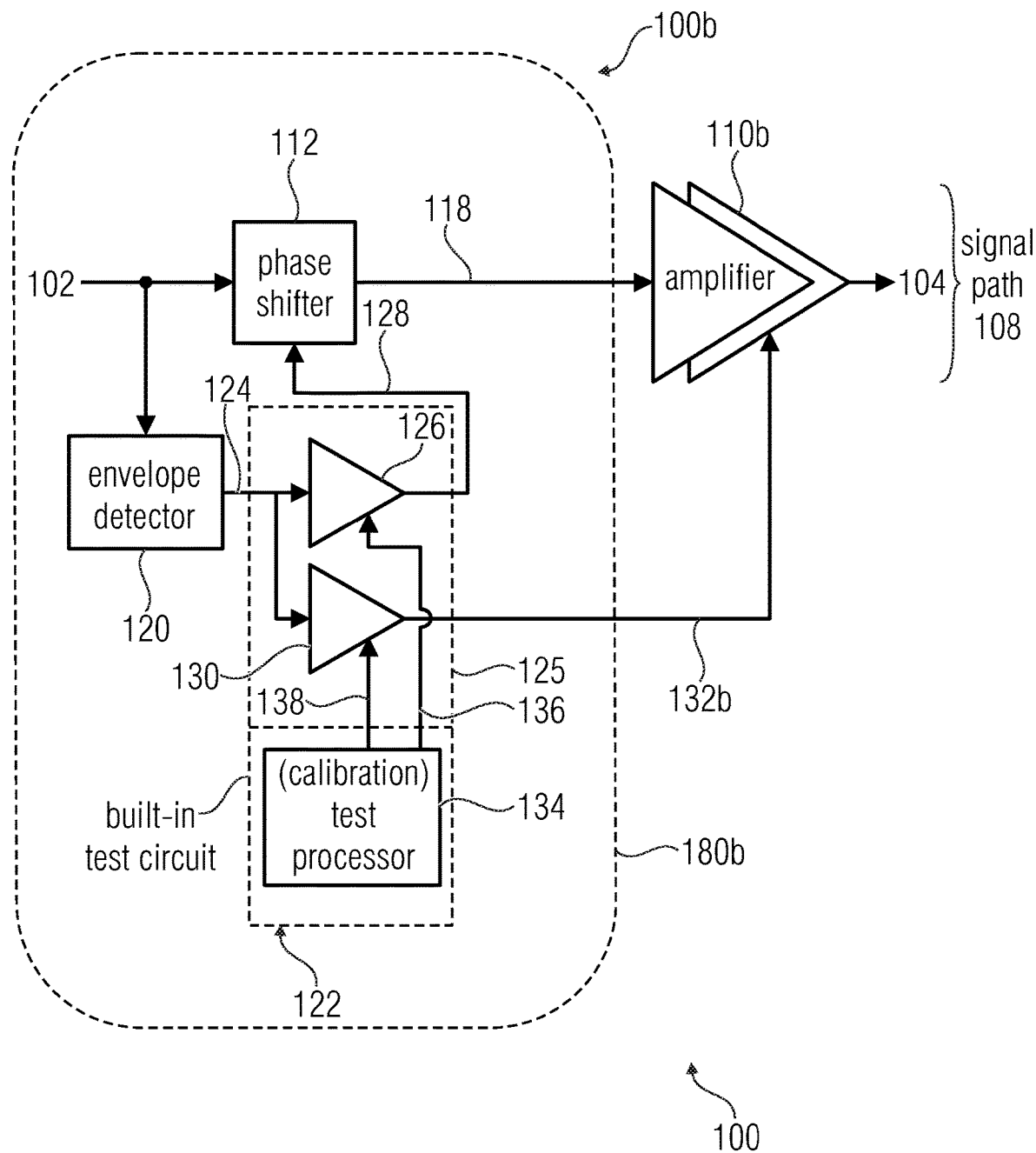

FIG. 1B shows a variant of a circuit arrangement 100b with a signal pre-distortion circuit 180b, in which most of the constructive and functional elements are analogous to those of the circuit arrangement 100 of FIG. 1a. Here, however, the amplifier 100b (e.g., power amplifier which may be a RF power amplifier, a HF power amplifier, or a mmWave power amplifier) may be directly controlled by the mapping circuit 130 (e.g., an analog mapping circuit). For example, the gain of the amplifier 100b may be controlled on the basis of the gain control signal 132b (e.g., analog gain control signal) mapping the envelope information 124 (e.g., analog envelope information). Therefore, on the basis of the value of the gain control signal 132b, the amplification imposed to the signal 118 (or another version of the signal in the signal path 108) may be adjusted. The amplifier 100b may be a programmable gain amplifier (the amplifier may be controlled by an analog input, for example).

In other examples, other types of the phase shifter 112 and/or the gain adjuster 116 may be adopted. There are known analog phase shifters for which a non-linear mapping characteristic may be defined on the basis of an input: in that case, the analog mapping circuit 126 may be linear. The gain adjuster 116 may also be non-linear: in that case, the analog mapping circuit 126 may be linear.

In other examples, a non-linear version of the phase shifter 112 may be controlled directly from the envelope detector 120: the mapping circuit 126 may therefore be avoided, or may be understood as being incorporated into the phase shifter 112. Analogously, a non-linear version of the gain adjuster 116 may be controlled directly from the envelope detector 120: the mapping circuit 130 may be avoided, or may be understood as being incorporated into the gain adjuster 116.

Even if FIGS. 1A and 1B have referred to both the adjustment of the phase and the amplitude, it is possible to implement a signal pre-distortion circuit which only adjusts the phase or only adjusts the gain. The former may be implemented, in FIG. 1a, by avoiding the gain adjuster 116 and the element 130 (and by avoiding the provision of the distortion information 138), while the latter may be implemented by avoiding the phase shifter 112 and the element 126 (as well as the avoiding the provision of the distortion information 136).

Figure 2:
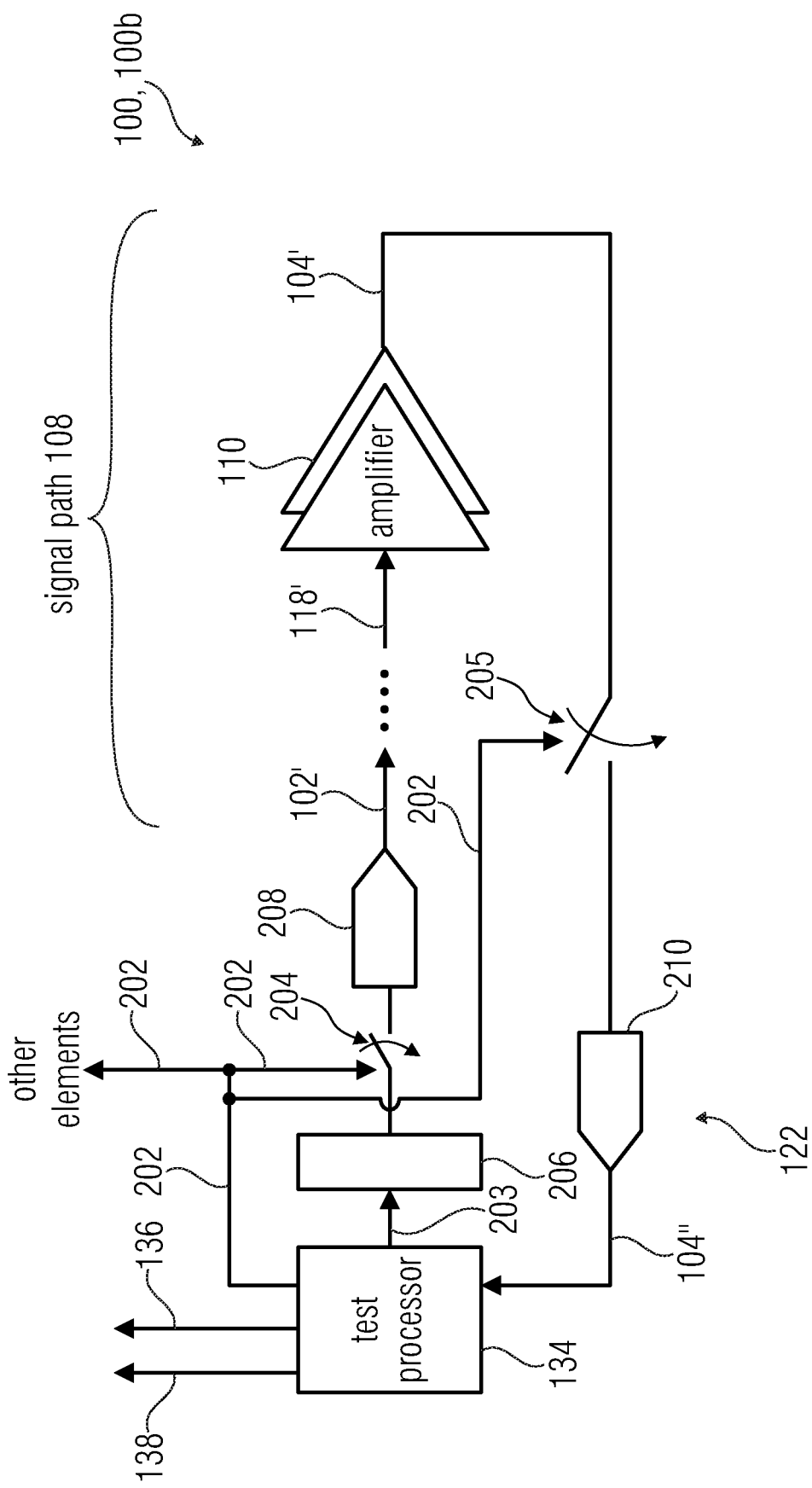

FIG. 2 shows the circuit arrangement 100, 100b and highlights the elements which are used to determine distortion information 136 and/or 138. The circuit arrangement 100, 100b may be switched between:

an operating mode, in which the input signal is processed in the signal path 108 to be transmitted as output signal 104 (FIGS. 1A, 1B); and a test mode, in which the distortion information 136 and/or 138 is determined (FIG. 2).

Here, a signal source 206 is represented as injecting an input signal onto the signal path 108. In the test mode the input signal is indicated with 102' to be distinguished from the normal input signal 102 used in the operating mode. The test input signal 102' may have a settable amplitude, so as to permit the built-in test circuit 122 to measure distortion information at different amplitudes. The signal source 206 may be controlled by a control signal 203 output by the test processor 134. For example, the test processor 134 may command the signal source 206 to sweep among a plurality of amplitudes of the test input signal 102'. The signal source 206 may be, in some cases, the same signal source 206 which normally generates the signal 106 in operating mode, or may in alternative be part of the built-in test circuit 122 (e.g., it may be integrated in the same test processor 134) or may be an external source.

FIG. 2 shows that the built-in test circuit 122 (or in particular the test processor 134) may output a mode control signal 202, which may control the functionalities of other elements of the circuit arrangement 100, so as to switch between the test mode and the operating mode. For example, if the mode control signal 202 indicates that the circuit arrangement 100, 100b is in operating mode, the signal source 206 may be deactivated by the switch 204. The mode control signal 202 may, in addition or alternative, be provided to other elements, such as to any of the envelope detector 120, the phase shifter 112, the gain adjuster 116, the amplifier 110 or 110b, and any of the mapping circuits 126 and 130. As for FIG. 2, at least ideally, the mode control signal 202 may control a switch 205 which is closed in the test mode and open in the operating mode. When the switch 205 is closed, the built-in test circuit 122 may receive the amplified test signal 104' at the output of the amplifier 110. In particular, the test processor 134 may compare the test signal 102' (as generated by the signal source 206) with the amplified test signal 104' (as obtained from the amplifier 110), so as to determine the distortion caused by the amplifier 110 for each envelope of the input test signal 104'.

A digital-to-RF converter (or a DAC) 208 may be provided downstream to the signal source 206. The signal source 206 (e.g., in cooperation with the digital-to-RF converter 208) may be configured to inject a test signal 102' (e.g., an analog signal) having at a settable amplitude. The amplitude may be controlled by the test processor 134, e.g., through a control signal 203. The test signal 102' may be subjected to the processing (e.g., analog processing) at the signal path 108 and provided (e.g., as analog signal version 118') to the amplifier 110. In some examples, however, the phase shifter 112 and/or the gain adjuster 116 may be deactivated, so that the signal versions 102' and 118' substantially coincide. The amplified test signal 104' at the output of the amplifier 110 may be provided to the test processor 134. A digitalized version 104'' of the amplified test 104' may be provided by an analog-to-digital converter (ADC) or a RF-to-digital converter.

The test processor 134 may control the signal source 206 to sweep along a plurality of amplitudes for the test signal 102'. Accordingly, the built-in test circuit 122 may receive a plurality of amplified test signals 104', so as to determine the behavior of the elements of the signal path in different states (e.g., for different amplitudes). Accordingly, the distortion information 136 and/or 138, to be provided to the mapping circuits 126 and/or 130, ma be generated on the basis of the comparison.

The distortion information 136 and/or 138 may be used, subsequently, in the operating mode, e.g., for adjusting the parameters of the phase shifter 112 and the gain adjuster 116, in order to keep into account the distortion to which the signal is subjected in the amplifier 110.

In some examples, during the test mode, the built-in test circuit 122 may control at least one of the mapping circuits 126 and 130, the envelope detector 120, the phase shifter 112, the gain adjuster 116, the amplifier 110 and 110b, so as to derive the most appropriated mapping of the envelope of the input signal into the phase shifts and/or gain adjustments. For example, in the test mode, the built-in test circuit 122 may control, besides the amplitude of the test signal, also the amplifications of the mapping circuits 126 and/or 130 (e.g., by controlling the outputs 136 and/or 138): the values of the signals 136 and/or 138 which minimize the distortion may be used as the distortion information to be provided to the mapping circuits 126 and/or 130.

Therefore, the built-in test circuit 122 may derive the distortion information, which is to be used for adjusting the mapping of the envelope to the phase shift and the gain on the basis of the distortion information obtained in the test mode.

In examples, at least one of the test processor, the signal source, the DAC or the digital-to-RF converter, the ADC or the RF-to-digital converter, and one of the mapping circuits may be part of the built-in circuit 122 and/or the signal pre-distortion circuit 180. At least some of the elements may be in the same chip and/or in the same board. In some cases, the test processor and/or the signal source 206 may be integrated in the same the same processor (e.g., a DSP) and/or may be integrated in the signal source which normally generates the input signal 102 to be amplified by the amplifier 110.

Figure 3:
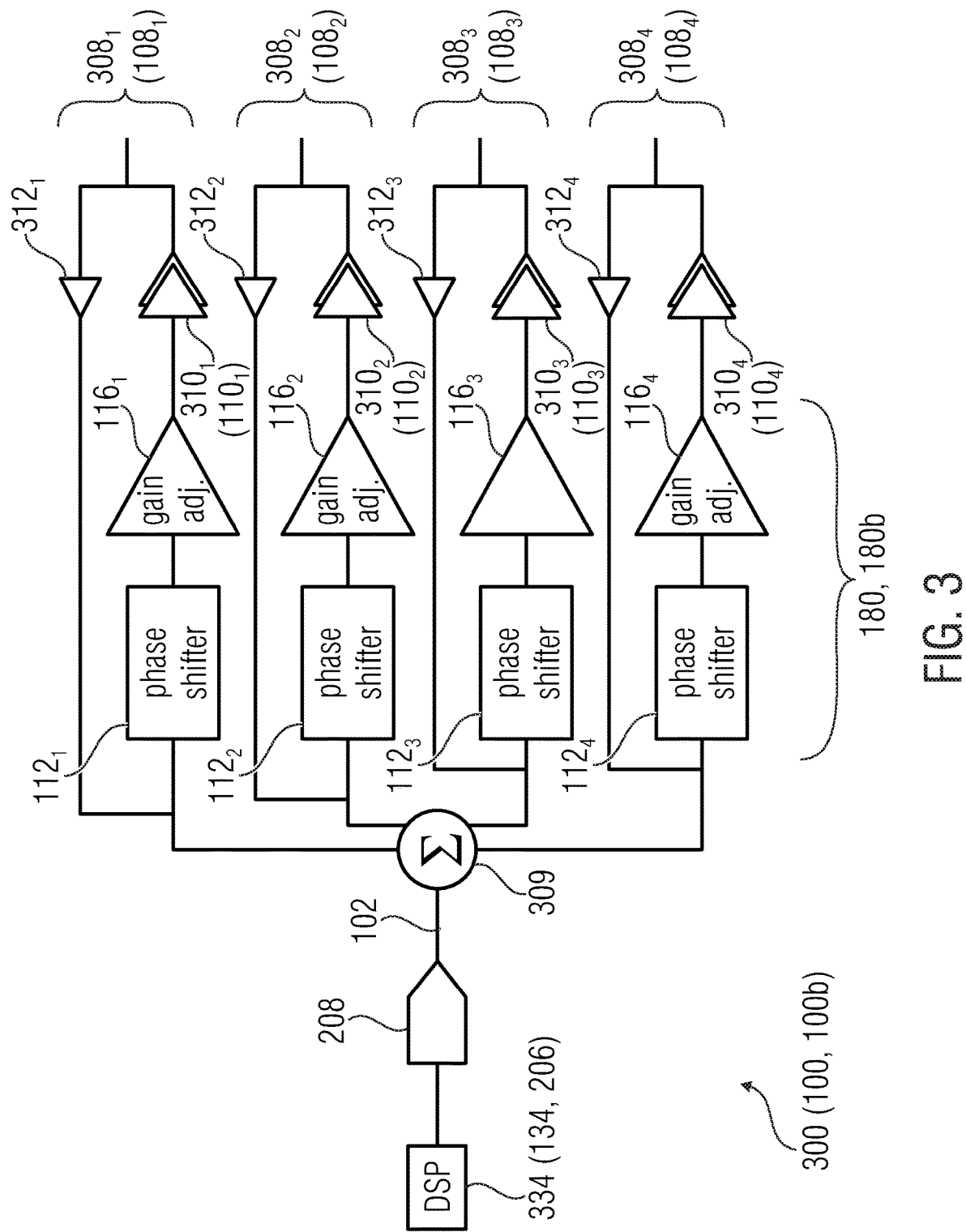

FIG. 3 shows an example of a system 300 (which may implement equipment of any of the circuit arrangements 100 or 100b). The circuit arrangement 300 may be used, for example, to feed a plurality of antenna elements of an antenna array, for beamforming, e.g. for a radar device (e.g., a radar device for cruise control) and/or a communication application (e.g., for communication standards such as 5G). These devices may be millimeter-wave devices and/or ultrawideband devices.

The circuit arrangement 300 may comprise at least one signal pre-distortion circuit 180 or 180b.

The circuit arrangement 300 may comprise a common signal source 334, here indicated as a digital signal processor, DSP 334 which, e.g. in cooperation with a digital-to-RF converter 208, may generate a common input signal 102. The common signal 102 may be split at element 309 (which may be a splitter/composer) to be fed to a plurality of branches or channels. Four channels $308_1$, $308_2$, $308_3$, $308_4$ are shown in FIG. 3. In different channels, analogous elements are distinguished by different indexes. In the subsequent passages of the description, where referring to characteristics common to the all the analogous elements, the indexes will be avoided.

Each channel 308 may comprise one signal path 108, in which the signal 102 is processed to provide an output signal 104.

Each signal path 108 may permit both transmission and reception of signals. In reception, multiple signals may be obtained by multiple antenna array and provided to the DSP 334 after having been composed by element 308. A low-noise amplifier (LNA) 312 may be used for amplifying the received signal.

Each signal path 108 may also comprise elements for controlling the beamforming, e.g., for coordinately applying weights to the signals in the different channels. These elements are not shown in FIG. 3.

In transmission, each signal path 108 may comprise an amplifier 310 (e.g., power amplifier, such as a RF power amplifier, HF power amplifier, mmWave power amplifier, etc.), which may be one of the amplifiers 110 discussed above. As explained above, the amplifier 310 may lose linearity at high amplitudes.

In order to cope with the distortions caused by the amplifier 310, a feed-forward technique may be implemented as described above. A gain adjuster 116 and/or a phase shifter 112 (which may be those discussed above) may therefore be used as a part of the signal pre-distortion circuit 180. In alternative examples (e.g., using a signal pre-distortion circuit 180b), the amplifier 310 may be the amplifier 110b and the gain adjuster 116 may therefore be avoided.

In FIG. 3, elements such as the envelope detector 120, the mapping circuits 126 and 130 are not shown.

In examples, the DSP 334 may be or have the role of the test processor 134 and may control the gain adjustment and/or the phase shift with a feed-forward strategy as discussed above (e.g., by adjusting the mapping of the envelope information 124 to the phase shift and/or gain that have to be imposed to the signal in the signal path 108). In other examples, the test processor 134 may be a processor separated from the DSP 334.

As for the circuit arrangements 100 and 100b, the circuit arrangement 300 may operate in operating mode and/or in test mode.

Figure 4:
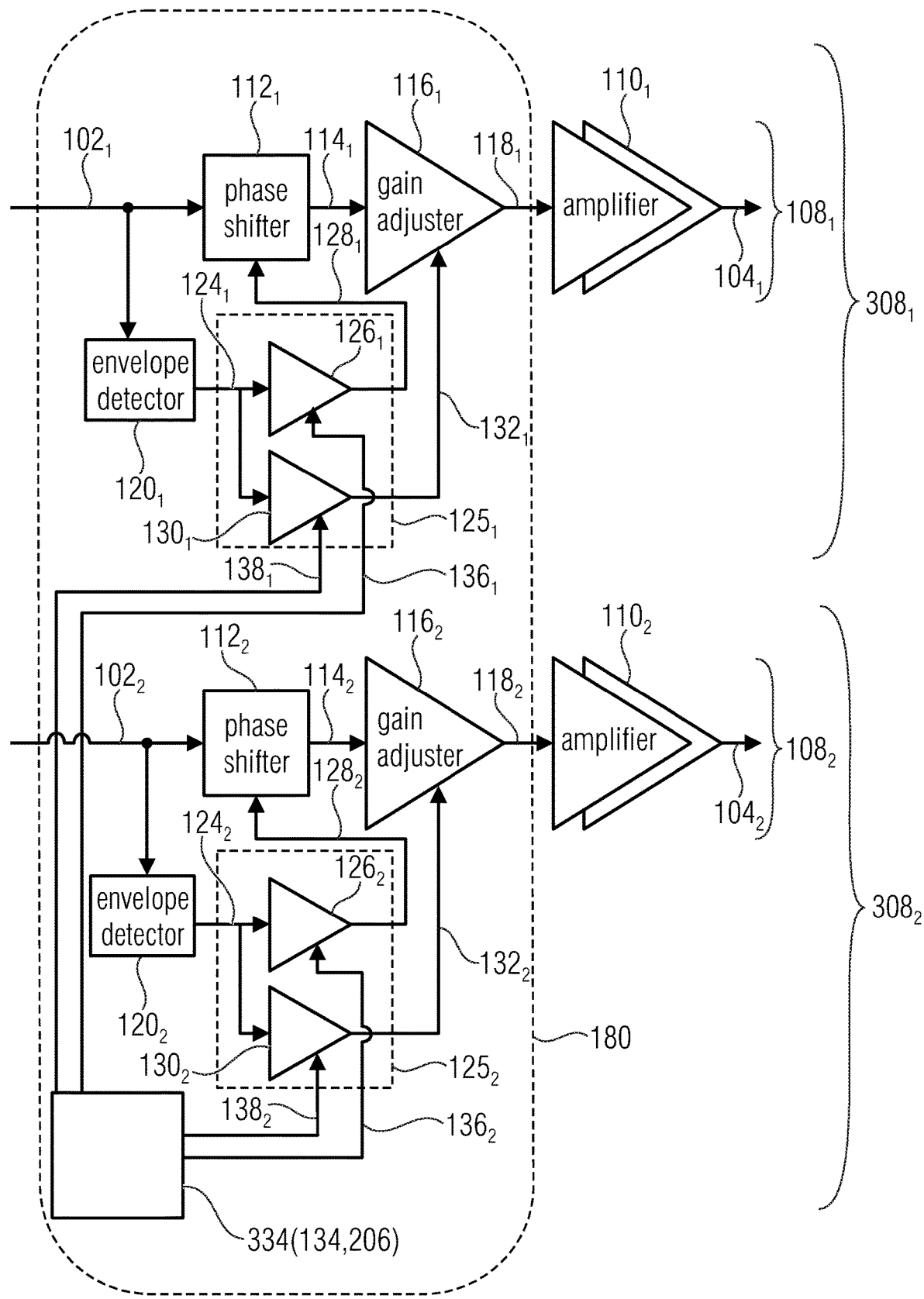

FIG. 4 illustrates the connections, between the DSP 334 and two channels $308_1$ and $308_2$, that are relevant in the operating mode (DACs or digital-to-RF converters downstream to the DSP 334 are here not shown). Apart from the index, the reference numerals are the same of those in FIG. 1A. For example, at channel $308_1$, the signal $102_1$ may be processed and be output as amplified signal $104_1$ and fed to a first antenna element, while at channel $308_2$, the signal 1022 may be processed and be output as amplified signal 1042 and fed to a second antenna element. Each channel 308 may comprise at least one of a signal path 108, an envelope detector 120, and mapping circuits 126 and 130. In examples, each of the envelope detector 120 and mapping circuits 126 and 130 is uniquely associated to one single signal path and uniquely operates to adjust the signal of the associated signal path.

The distortion information is in general not the same for different channels $308_1$ and $308_2$. For example, the signal at channel $308_1$ may be adjusted on the basis of distortion information $136_1$ and/or $138_1$ which is in general different from the distortion information $136_2$ and/or $138_2$ provided to adjust the signal at channel $308_2$.

In general terms, the distortion information is different for different channels because different amplifiers (even if manufactured as identical components) are subjected to different distortions and cause different non-linear behaviors. Therefore, each signal is adjusted according to a specific rule that keeps into account for the specific behavior of the amplifier.

Even if the distortion is compensated differently at each channel, there is no necessity of a plurality of test processors for performing different calibrations. For example, the single DSP 334 may control all the mapping circuits 126 and/or 130 independently. In respect to the digital feedback-based technique of the prior art, an important reduction of hardware resources may be achieved. Notably, the present technique does not sacrifice quality, as the fine adjustment of each signal at each channel is notwithstanding obtained.

Figure 5:
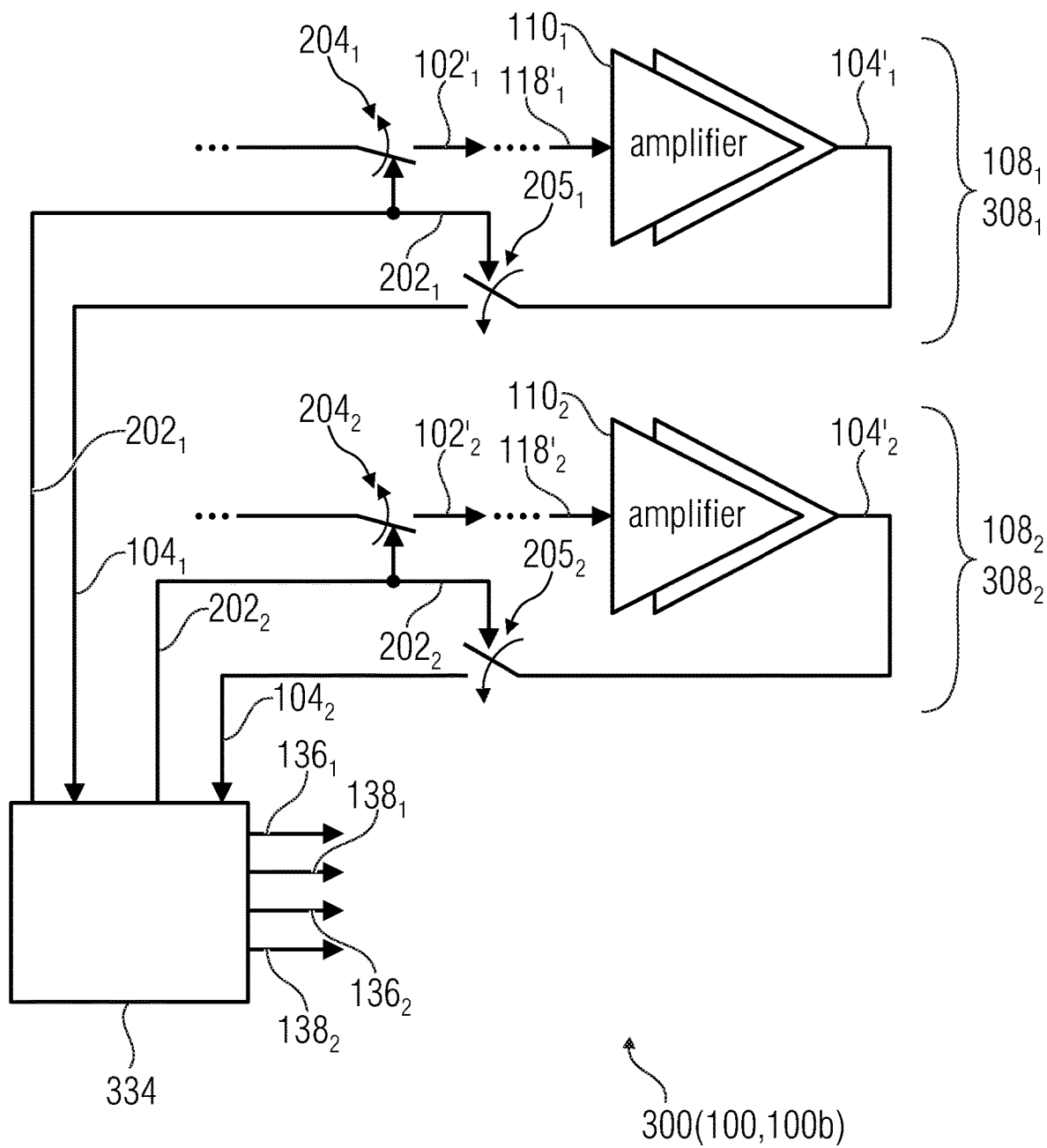

FIG. 5 shows relevant connections for the circuit arrangement 300 in test mode. For each channel, the provision of the test signal 102' the signal path may be inhibited by opening the switch 204, while the provision of amplified test signal 104' back to the test processor 334 may be inhibited by opening the switch 205. Other techniques may be used.

In test mode, each channel 308 may be fed with a test signal 102' (e.g., $102'_1, 102'_2$, etc.) at one specific time instant. Each channel may be calibrated independently of the other ones (e.g., during subsequent calibration iterations in the same calibration session). For each channel, a test session is performed (e.g., iteratively), hence obtaining distortion information to be provided to the mapping circuits of the same channel. For example:

when the channel $308_1$ is calibrated (switches $204_1$ and $205_1$ closed and switches $204_2$ and $205_2$ open), the distortion information $136_1$ and/or $138_1$ is obtained;

subsequently (e.g., at a subsequent calibration iteration), when the channel $308_2$ is calibrated (switches $204_1$ and $205_1$ open and switches $204_2$ and $205_2$ closed), the distortion information $136_2$ and/or $138_2$ are obtained.

Even if the DSP 334 is shown, for the sake of clarity, as being connected with other components through a multiplicity of lines, it is possible to make use of techniques (such as switches, deviators, digital encoders/decoders, etc.) which reduce the number of the input/output pins actually used by the DSP.

The elements 126 and 130 may be, in examples, programmable (e.g., analog) elements: they may store the received distortion information and maintain it up to the subsequent calibration. A constant connection with the DSP is therefore not needed.

Figure 6:
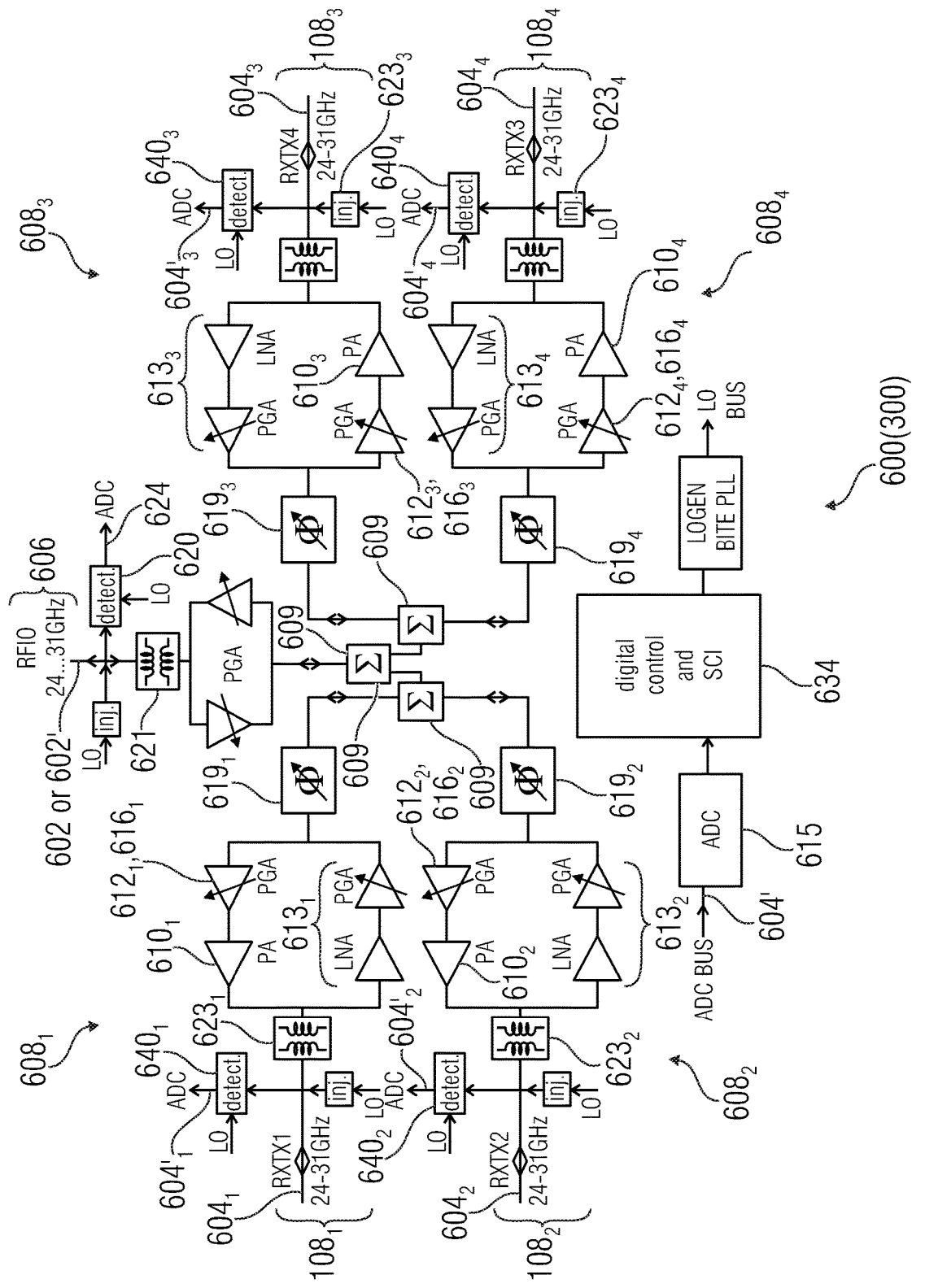

FIG. 6 shows a circuit arrangement 600, which may be an example of the circuit arrangement 300, and may provide a plurality of output signals $604_1, 604_2, 604_3, 604_4$, e.g., for beamforming (signals $604_1, 604_2, 604_3, 604_4$ may be RF signals, HF signals, mmWave signals, etc.). The input signal 602 (e.g., analog signal) may be provided by a common signal source 606 (which may be internal or external). The input signal 602 may be split (e.g., by splitters/composers 609) into a plurality of signals (e.g., analog signals), each of which is fed to a different channel 608 ($608_1, 608_2$, etc.). Each channel 608 (associated to a respective signal path 108) may comprise a HF amplifier 610 (e.g., HF power amplifier, a RF power amplifier) which may be subjected to distortion, as discussed above. Each channel 608 may comprise a phase shifter 612 and/or a gain adjuster 616, which may be as above. Here, the phase shifter and the gain adjuster are shown as being in one single device PGA (phase-and-gain adjuster), but they may also be separated (e.g., as in FIG. 1a or in FIG. 1b). The PGAs 612, 616 may therefore be part of the signal pre-distortion circuit. Each channel 608 may include a delay generator 619 which may operate in coordination with the delay generators of the other channels to control the beamforming.

In operating mode, each PGA 612, 616 may condition the signal (e.g., analog signal) in the signal path 108 to compensate for the distortions caused by the respective amplifier 610. As for the techniques discussed above, each PGA 612, 616 may operate by amplifying differently and/or by shifting the phase differently of the signal in the respective signal in the signal path 108 on the basis of the detected envelope. An envelope detector 620 (which may be a voltage detector) may detect envelope information 624 concerning the common signal 602. Accordingly, the gain and the phase shift at the PGA 612, 616 may be adjusted. A processor 634 (which may also have the function of test processor and/or may be a DSP and/or which may be of the built-in type) may control the operations in real time.

In test mode, each channel 608 may be calibrated, e.g., by determining the preferred relationships that have to be chosen for mapping the envelopes into gains and/or phase-shift at the PGA 612, 614. For example, techniques as discussed above may be used.

In particular, in the test mode, instead of the input signal 602, a test input signal 602' may be injected by the common signal source 606. Accordingly, a detector 640 may be used for determining the test amplified signal 604'.

The detector 640 may comprise an IQ (inphase-quadrature) determiner which may provide a version (which may be analog) of the amplified test signal 604' in the IQ space. The IQ determiner may be configured to:

multiply a version of the amplified test signal by a local oscillator (LO) signal, so as to provide the I version of the amplified test signal 604'; and multiply a delayed version (delayed of 90°) of the amplified test signal by the LO signal, so as to provide the Q version of the amplified test signal 604'.

The I and Q versions of the amplified test signal 604' may be converted into digital signals at the ADC 615 (or RF-to-digital converter in other examples), and provided to the processor 634 for determining the distortion information.

A DC-removing filter 621 may be placed between the signal source 606 and the splitters/composers 609. A DC-removing filter 623 may be placed downstream of each amplifier 610. At least one of the DC-removing filters may be a transformer-based filter (other types of filters may be provided in other examples).

Receiving lines 613 may be provided, e.g., each in parallel to a channel 608 and/or a signal path 108 (e.g., to an amplifier 610 and/or the PGA 612, 616). For each channel 608, the parallel formed by the receiving line 613 and the channel 608 and/or signal path 108 may be in series to (e.g., downstream of) the respective delay generator 619.

In the example of FIG. 6, at least two of the PGAs 612, their control logic, at least some of the envelope detector 640, the processor 634, and the amplifier 610 may coexist in the same board and/or in the same chip.

Figure 7:
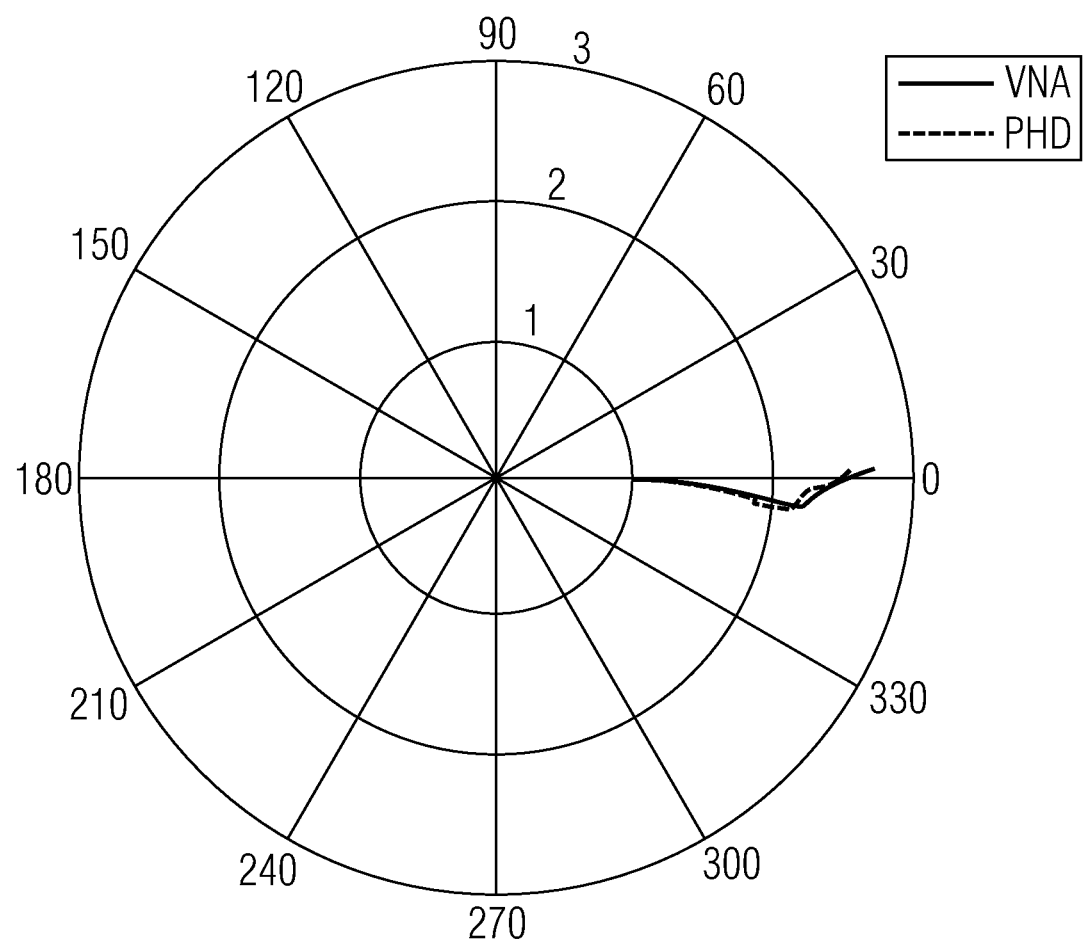
FIG. 7 shows a graph showing a result of an experiment.

FIG. 7 shows the result of an experiment carried out with the circuit arrangement 600. An external reference oscillator frequency has been provided at external oscillator input 646, provided by a vector network analyzer. The vector network analyzer has also injected an input signal (e.g., RF signal, HF signal, mmWave signal, etc.), hence operating as the common signal source 606. Further, the vector network analyzer has analysed the output signal 604 (e.g., 604₁). The results are shown in the diagram of FIG. 7.

Figure 8:
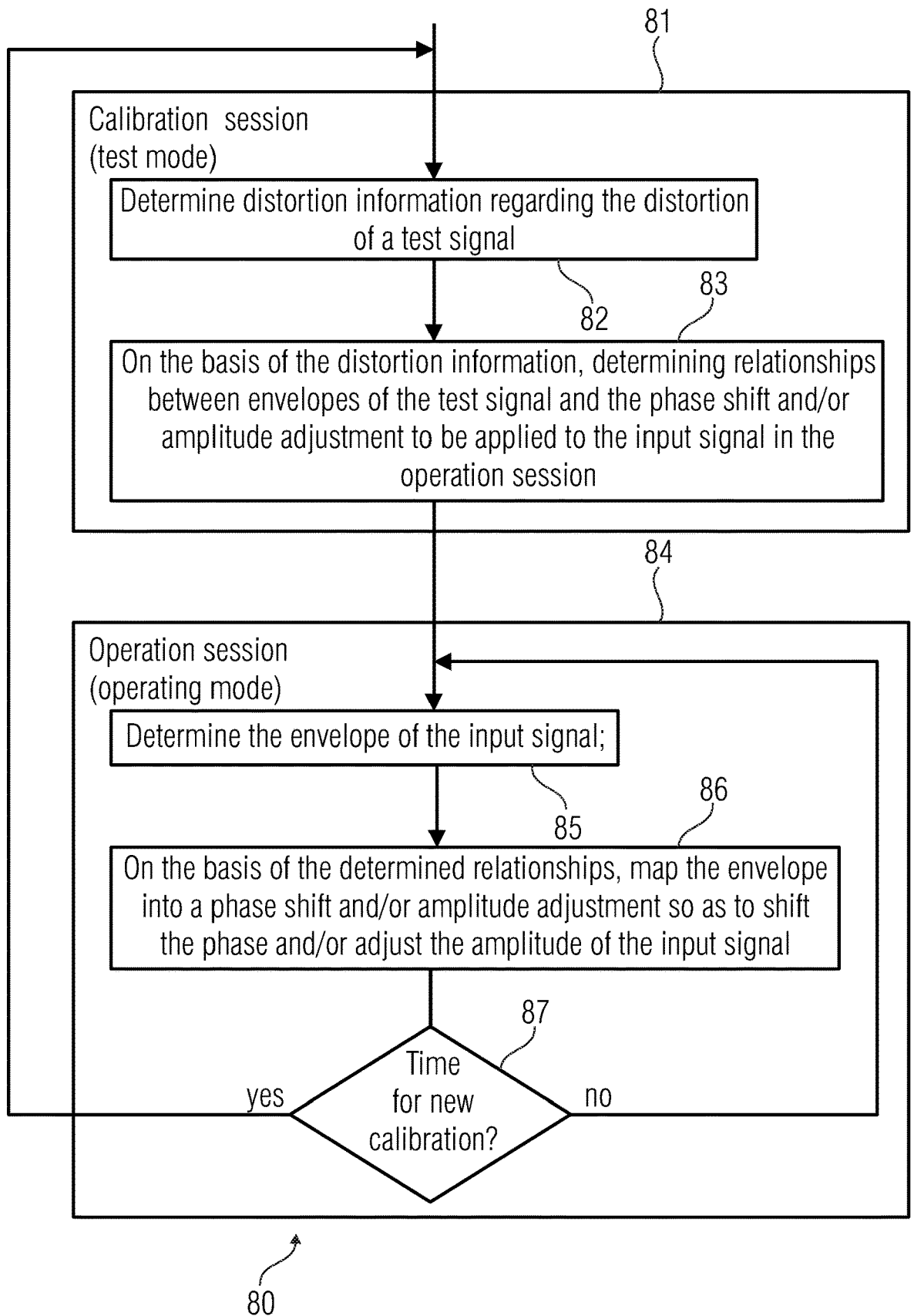
FIG. 8 shows a method according to an example.

FIG. 8 shows a method 80 according to an example. The method may be implemented, for example, by equipment as discussed above. The method 80 may comprise, for example, a calibration (test) session 81 and an operation session 84. During the calibration session 81 the circuit arrangement may be in test mode. At step 82 of the calibration session, determining distortion information (e.g., 136, 138) regarding the distortion of a test signal (e.g., 102') may be performed. At step 83, on the basis of the distortion information (e.g., 136, 138), determining relationships between envelopes of the test signal (e.g., 102') and the phase shift and/or amplitude adjustment to be applied to the input signal (e.g., 102) in the operation session may be performed. The calibration session 81 may be performed, for example, periodically, and/or at particular time instants (e.g., when powering the circuitry).

In examples (e.g., when multiple channels and/or HF, RF, mmWave amplifiers are present, such as in examples of FIGS. 3-6), the calibration session may be iterative: a calibration session may comprise a plurality of calibration iterations, each calibration iteration being repeated for each channel and/or HF, RF, mmWave amplifier, so as to obtain distortion information associated to each channel and/or HF, RF, mmWave amplifier.

After the calibration session 81, the operation session 84 may start. At step 85 of the operation session, determining the envelope of the input signal (e.g., 102) may be performed in real time. At step 86, on the basis of the determined relationships, mapping the envelope into a phase shift and/or amplitude adjustment so as to shift the phase and/or adjust the amplitude of the input signal (e.g., 102) may be performed. In examples, at step 87 it is checked whether it is time for performing a new calibration. For example, if an extremely high timer (e.g., 1 hour) is expired, a new calibration session 81 is initiated. Otherwise, a new operation session 84 is initiated by invoking step 85.

Examples above may be implemented in one chip structure including a calibration processor (e.g., 134) configured to measure the distortion information (e.g., 136, 138) from the output of the amplifier (e.g., 110) and/or to control a mapping between the envelope information (e.g., 124) and the variable phase shift (e.g., 128) and/or the gain control signal (e.g., 132).

In examples above reference is often made to digital-to-RF converters, which may convert digital signals into RF signals (e.g., HF signals, mmWave signals, etc.) and to RF-to-digital converters, which may convert RF signals (e.g., HF signals, mmWave signals, etc.) into digital signals. The digital-to-RF converters may comprise the necessary equipment to perform the conversion (e.g., one or more ADC, an up/down converter, etc., in a single-stage or multi-stage configuration). Where ADCs or DACs are referred to, alternatively, a RF-to-digital or digital-to-RF converters, respectively, whether they respectively include one or more ADC or one or more DAC or not, may be used.

Generally, examples may be implemented as a computer program product with program instructions, the program instructions being operative for performing one of the methods when the computer program product runs on a computer. The program instructions may for example be stored on a machine readable medium.

Other examples comprise the computer program for performing one of the methods described herein, stored on a machine-readable carrier.

In other words, an example of method is, therefore, a computer program having program instructions for performing one of the methods described herein, when the computer program runs on a computer.

A further example of the methods is, therefore, a data carrier medium (or a digital storage medium, or a computer-readable medium) comprising, recorded thereon, the computer program for performing one of the methods described herein. The data carrier medium, the digital storage medium or the recorded medium are tangible and/or non-transitionary, rather than signals which are intangible and transitory.

A further example of the method is, therefore, a data stream or a sequence of signals representing the computer program for performing one of the methods described herein. The data stream or the sequence of signals may for example be transferred via a data communication connection, for example via the Internet.

A further example comprises a processing means, for example a computer, or a programmable logic device performing one of the methods described herein.

A further example comprises a computer having installed thereon the computer program for performing one of the methods described herein.

A further example comprises an apparatus or a system transferring (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some examples, a programmable logic device (for example, a field programmable gate array) may be used to perform some or all of the functionalities of the methods described herein. In some examples, a field programmable gate array may cooperate with a microprocessor in order to perform one of the methods described herein. Generally, the methods may be performed by any appropriate hardware apparatus.

The above described examples are merely illustrative for the principles discussed above. It is understood that modifications and variations of the arrangements and the details described herein will be apparent. It is the intent, therefore, to be limited by the scope of the impending claims and not by the specific details presented by way of description and explanation of the examples herein.

Equal or equivalent elements or elements with equal or equivalent functionality are denoted in the following description by equal or equivalent reference numerals even if occurring in different figures.

| Element | Sign |
| --- | --- |
| circuit arrangement | 100, 100b, 300, 600 |
| signal path | 108 |
| amplifier | 110, 110b, 310, 610 |
| input signal | 102, 602 |
| test signal | 102', 602' |
| amplified signal | 104 |
| amplified test signal | 104' |
| phase shifter | 112, 612 |
| gain adjuster | 116, 616 |
| phased-shifted signal | 114 |
| amplitude-adjusted signal | 116 |
| amplitude-adjusted version of the input signal | 118 |
| envelope detector | 120, 620 |

-continued

| Element | Sign |
| --- | --- |
| built-in test circuit | 122 |
| envelope information | 124, 624 |
| test processor | 134 |
| phase shift adjustment signal | 128 |
| mapping circuit | 125, 126, 130 |
| gain control signal | 132, 132b |
| built-in test circuit | 122 |
| phase-related distortion information | 136 |
| gain-related distortion information | 138 |
| signal pre-distortion circuit | 180, 180b |
| mode control signal | 202 |
| control signal | 203 |
| switch | 204, 205 |
| test signal source | 206 |
| DAC or digital-to-RF converter | 208 |
| ADC or RF-to-digital converter | 210, 615 |
| channel | 308, 608 |
| splitter/composer | 309, 609 |
| LNA | 312 |
| DSP | 334, 634 |
| common signal source | 606 |
| receiving line | 613 |
| delay generator | 619 |
| DC removing filter | 621, 623 |
| detector for determining the test amplified signal | 640 |

The invention claimed is:

1. A circuit arrangement comprising:
an amplifier to amplify a modulated signal inputted to the amplifier;
a signal pre-distortion circuit operative to perform a feed-forward pre-distortion of the modulated signal in a signal path comprising the amplifier, the signal pre-distortion circuit including:
an envelope detector operative to provide envelope information describing an envelope of the modulated signal; and
a built-in test circuit operative to generate distortion information representing a distortion in the signal path caused by amplitude variations;
the signal pre-distortion circuit being operative to perform the feed-forward pre-distortion of the modulated signal based on the distortion information, in which the signal pre-distortion circuit is operative to:
apply a variable phase shift to the modulated signal in the signal path dependent on the envelope information, a relationship between the envelope information and the variable phase shift being dependent on the distortion information provided by the built-in test circuit; and
control a gain of the modulated signal in the signal path dependent on the envelope information, a relationship between the envelope information and a gain control signal applied to the amplifier depending on the distortion information provided by the built-in test circuit;
the circuit arrangement further comprising:
a plurality of amplifiers, the circuit arrangement further operable to derive a plurality of signals to be amplified by the amplifiers from a common input signal, and wherein the signal pre-distortion circuit is operative to subject each of the derived signals to a pre-distortion amount based on distortion information associated to each of the amplifiers.

2. The circuit arrangement according to claim 1, wherein the signal pre-distortion circuit is operative to adjust the variable phase shift to follow instantaneous envelope information and provide the gain control signal to follow instantaneous envelope information.

3. The circuit arrangement according to claim 1, wherein the envelope detector is operative to provide the envelope information as an analog envelope signal, the circuit arrangement further comprising:
a mapping circuit operative to:
map the analog envelope signal to an analog phase shift adjustment signal, and adjust the modulated signal via the analog phase shift adjustment signal as indicated by the distortion information; and
map the analog envelope signal to an analog gain control signal, and adjust the modulated signal via the analog gain control signal as indicated by the distortion information.

4. The circuit arrangement according to claim 1, wherein the signal pre-distortion circuit includes a mapping circuit operable to: i) obtain a non-linear, adjustable mapping characteristic, and ii) adjust the non-linear mapping characteristic of the modulated signal depending on the envelope information.

5. The circuit arrangement according to claim 1, wherein the signal pre-distortion circuit operates in an operational bandwidth greater than a modulation bandwidth of corresponding modulation used to produce the modulated signal.

6. The circuit arrangement according to claim 5, wherein the operational bandwidth is greater than two times the modulation bandwidth of the corresponding modulation used to produce the modulated signal.

7. The circuit arrangement according to claim 1, wherein the built-in test circuit is operative to determine the distortion information which comprises information about an amplitude-modulation—to—amplitude-modulation distortion and an information about an amplitude-modulation—to—phase-modulation distortion.

8. The circuit arrangement according to claim 1, wherein the built-in test circuit is operative to determine, in a test mode, an amplitude of an outputted test signal at an output of the amplifier to derive the distortion information and a phase of the outputted test signal at the output of the amplifier to derive the distortion information.

9. The circuit arrangement according to claim 1, further comprising a test signal source operative to inject a test signal into the amplifier, the amplifier amplifying the test signal into an amplified test signal outputted from the amplifier, the test signal having a settable amplitude in which the built-in test circuit measures the distortion information relative to the amplified test signal at an output of the amplifier.

10. The circuit arrangement according to claim 1, operative to switch between a test mode and an operating mode, and, in the test mode, measure the distortion information and determine the relationship between the envelope information and the variable phase shift and the relationship between the envelope information and the gain control signal.

11. The circuit arrangement according to claim 10, further operative to generate, in the test mode, a plurality of test signals inputted to the amplifier at different amplitudes.

12. The circuit arrangement according to claim 1, wherein the signal pre-distortion circuit is operative to define the distortion information which comprises information associated to a state which, in a test mode, reduces distortion of an output test signal from the amplifier.

13. The circuit arrangement according to claim 1, wherein the signal pre-distortion circuit is operative to
comparatively increase the phase shift and reduce the gain of the modulated signal in the signal path for a comparatively higher envelope, and
comparatively reduce the phase shift and increase the gain of the modulated signal in the signal path for a comparatively lower envelope.

14. The circuit arrangement according to claim 1, further comprising a chip structure including a calibration processor operative to: i) measure the distortion information from an output of the amplifier, and ii) control a mapping between the envelope information and the variable phase shift and the gain control signal.

15. The circuit arrangement according to claim 1, further comprising a chip including the signal pre-distortion circuit.

16. The circuit arrangement as in claim 1, wherein the envelope detector includes a low pass filter operative to detect the envelope of the modulated signal.

17. The circuit arrangement as in claim 1, wherein the envelope information indicates a shape of the envelope of the modulated signal.

18. The circuit arrangement as in claim 1, wherein the signal pre-distortion circuit is operative to:
increase the phase shift and reduce the gain of the modulated signal in the signal path for an instance of a higher detected magnitude of the envelope; and
reduce the phase shift and increase the gain of the modulated signal in the signal path for an instance of lower detected magnitude of the envelope.

19. The circuit arrangement as in claim 1, wherein the signal pre-distortion circuit is operative to:
generate the distortion information based on input of a test signal to the signal path.

20. The circuit arrangement as in claim 1, wherein a bandwidth of the envelope detector is greater than a modulation bandwidth of modulation imposed on the modulated signal.

21. A circuit arrangement comprising:
an amplifier to amplify a modulated signal inputted to the amplifier;
a signal pre-distortion circuit operative to perform a feed-forward pre-distortion of the modulated signal in a signal path comprising the amplifier, the signal pre-distortion circuit including:
an envelope detector operative to provide envelope information describing an envelope of the modulated signal; and
a built-in test circuit operative to generate distortion information representing a distortion in the signal path caused by amplitude variations;
the signal pre-distortion circuit being operative to perform the feed-forward pre-distortion of the modulated signal based on the distortion information, in which the signal pre-distortion circuit is operative to:
apply a variable phase shift to the modulated signal in the signal path dependent on the envelope information, a relationship between the envelope information and the variable phase shift being dependent on the distortion information provided by the built-in test circuit; and
control a gain of the modulated signal in the signal path dependent on the envelope information, a relationship between the envelope information and a gain control signal applied to the amplifier depending on the distortion information provided by the built-in test circuit;

wherein the signal pre-distortion circuit is further operative to: i) modify the gain of the amplifier depending on the distortion information, the distortion information mapping a relationship of the envelope information to the gain.

22. A method comprising:
a calibration session including operations of:
producing distortion information regarding distortion of a test signal amplified by an amplifier, the distortion information indicating relationships between envelopes of the test signal and corresponding phase shifts and gain adjustments to be applied to an input signal of the amplifier in an operation session;
the operation session including operations of:
determining an envelope of the input signal; and
via the distortion information, mapping the determined envelope into a phase shift amount and an amplitude adjustment amount; and
applying the phase shift amount and the amplitude adjustment amount to the input signal to produce an output signal from the amplifier, the output signal being phase shifted and amplitude adjusted with respect to the input signal as specified by the phase shift amount and the amplitude adjustment amount;
wherein the calibration session further comprises:
performing a plurality of iterations, each iteration of the plurality of iterations determining distortion information of one particular amplifier among a plurality of amplifiers.

23. The method according to claim 22, wherein the calibration session is one of multiple calibration sessions, each of the calibration sessions being performed at intervals greater than 3600 seconds.

24. A beamforming method comprising the method according to claim 22; and the beamforming method further comprising:
feeding an antenna array with amplified output signals of the amplifier generated during the operation session.

25. A non-transitory storage unit storing instructions which, when executed by a processor, cause the processor to perform the method according to claim 22.

26. The method of claim 22, wherein applying the phase shift amount and the amplitude adjustment amount to the input signal includes:
performing feed-forward distortion of the input signal via application of the phase adjustment amount and the gain adjustment amount to the amplifier, the input signal being a modulated signal.

27. The method as in claim 22, wherein producing the distortion information includes:
inputting the test signal into the amplifier prior to determining the envelope of the input signal; and
producing the distortion information based on an output of the amplifier amplifying the test signal at different amplitudes.

28. The method as in claim 22 further comprising:
during the operation session, producing the output signal from an output of the amplifier without feedback from the output of the amplifier.

29. An apparatus comprising:
a circuit operative to:
detect an envelope of a modulated signal inputted to an amplifier;
via distortion information generated during testing of the amplifier, map the detected envelope of the modulated signal to a phase adjustment value and a gain adjustment value; and apply the phase adjustment value and the gain adjustment value to the amplifier, the amplifier operative to adjust the modulated signal into an amplified output signal outputted from an output of the amplifier based on the phase adjustment value and the gain adjustment value;

wherein the circuit is further operable to perform feed-forward distortion of the modulated signal via application of the phase adjustment value and the gain adjustment value to the amplifier;

wherein the circuit further comprises:

a tester operative to: i) input a test signal into the amplifier prior to detection of the envelope, and ii) produce the distortion information based on an output of the amplifier amplifying the test signal; and wherein the distortion information maps envelopes of the test signal to phase adjustment values and gain adjustment values.

30. The apparatus as in claim 29, wherein the circuit is further operable to produce the distortion information mapping envelopes of the test signal to phase adjustment values and gain adjustment values based on adjusting an amplitude of the test signal.

31. The apparatus as in claim 29, wherein the circuit is operative to produce the amplified output signal outputted from the amplifier without feedback from the output of the amplifier.

32. A circuit arrangement comprising:

an amplifier to amplify a modulated signal inputted to the amplifier;

a signal pre-distortion circuit operative to perform a feed-forward pre-distortion of the modulated signal in a signal path comprising the amplifier, the signal pre-distortion circuit including:

an envelope detector operative to provide envelope information describing an envelope of the modulated signal; and a built-in test circuit operative to generate distortion information representing a distortion in the signal path caused by amplitude variations;

the signal pre-distortion circuit being operative to perform the feed-forward pre-distortion of the modulated signal based on the distortion information, in which the signal pre-distortion circuit is operative to:

apply a variable phase shift to the modulated signal in the signal path dependent on the envelope information, a relationship between the envelope information and the variable phase shift being dependent on the distortion information provided by the built-in test circuit; and control a gain of the modulated signal in the signal path dependent on the envelope information, a relationship between the envelope information and a gain control signal applied to the amplifier depending on the distortion information provided by the built-in test circuit;

wherein the amplifier is a variable gain amplifier, the gain of the modulated signal controlled via input of the gain control signal to the variable gain amplifier.

\* \* \* \* \*